(12) United States Patent
Baek et al.

(10) Patent No.: US 12,336,228 B2
(45) Date of Patent: Jun. 17, 2025

(54) THIN FILM TRANSISTOR AND DISPLAY APPARATUS INCLUDING THE SAME

(71) Applicant: Samsung Display Co., Ltd., Yongin-Si (KR)

(72) Inventors: Jongjun Baek, Yongin-si (KR); Jongoh Seo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 462 days.

(21) Appl. No.: 17/877,153

(22) Filed: Jul. 29, 2022

(65) Prior Publication Data

US 2023/0053153 A1 Feb. 16, 2023

(30) Foreign Application Priority Data

Aug. 12, 2021 (KR) .................. 10-2021-0106939

(51) Int. Cl.
*H01L 29/786* (2006.01)
*H01L 27/32* (2006.01)
*H10D 30/67* (2025.01)
*H10K 59/124* (2023.01)

(52) U.S. Cl.
CPC ....... *H10D 30/6757* (2025.01); *H10K 59/124* (2023.02)

(58) Field of Classification Search
CPC ............. H10H 20/8312; H10H 20/831; H10H 20/018; H10H 20/01; H10H 20/812; H10H 20/825; H10H 20/841; H10H 20/032; H10H 20/034; H10H 20/813; H10H 20/817; H10H 20/833; H10H 20/01335; H10H 20/0137; H10H 20/814; H10H 20/013; H10H 20/824; H10H 20/8215; H01L 24/31; H01L 24/66; H01L 24/49; H01L 23/00; H01L 23/66; H01L 25/075; H01L 25/0753; H01L 25/0756; H01L 33/26; H01L 33/486; H01L 33/0008

See application file for complete search history.

(56) References Cited

U.S. PATENT DOCUMENTS 8,053,342 B2    11/2011   Lee et al.
10,991,687 B2    4/2021   Tsai et al.
2021/0159113 A1  5/2021   Choi et al.

FOREIGN PATENT DOCUMENTS

JP    2003-008002 A      1/2003
KR    1020050104514 A   11/2005
KR    10-0868097 B1     11/2008
KR    10-1979752 B1      5/2019

*Primary Examiner* — Nikolay K Yushin
(74) *Attorney, Agent, or Firm* — Innovation Counsel LLP

(57) ABSTRACT

Provided are a thin film transistor capable of minimizing the level of a leakage current and a display apparatus including the same. The thin film transistor includes a buffer layer disposed over a substrate, and a semiconductor layer disposed over the buffer layer, wherein the semiconductor layer includes a first area doped with a first conductivity type and disposed adjacent to an upper surface of the semiconductor layer, a second area spaced apart from the first area, doped with the first conductivity type, and disposed adjacent to the upper surface of the semiconductor layer, a third area doped with a second conductivity type different from the first conductivity type and disposed under the first area, and a fourth area doped with the second conductivity type and disposed under the second area.

20 Claims, 5 Drawing Sheets

THIN FILM TRANSISTOR AND DISPLAY APPARATUS INCLUDING THE SAME

CROSS-REFERENCE TO RELATED APPLICATION

This application is based on and claims priority under 35 U.S.C. § 119 to Korean Patent Application No. 10-2021-0106939, filed on Aug. 12, 2021, in the Korean Intellectual Property Office, the disclosure of which is incorporated by reference herein in its entirety.

BACKGROUND

1. Field

One or more embodiments relate to a thin film transistor and a display apparatus including the same, and more particularly, to a thin film transistor capable of minimizing the level of a leakage current and a display apparatus including the thin film transistor.

2. Description of the Related Art

Generally, in a display apparatus such as an organic light emitting display apparatus, thin film transistors are arranged in each (sub)pixel to control the luminance or the like of each (sub)pixel. The thin film transistors are configured to control the luminance or the like of the corresponding (sub)pixel according to a received data signal or the like.

SUMMARY

However, such a display apparatus of the related art has a problem in that a high-quality image may not be displayed due to the occurrence of a leakage current in a thin film transistor.

In order to solve various problems including the above problem, one or more embodiments include a thin film transistor capable of minimizing the level of a leakage current and a display apparatus including the same. However, these problems are merely examples and the scope of the disclosure is not limited thereto.

Additional aspects will be set forth in part in the description which follows and, in part, will be apparent from the description, or may be learned by practice of the presented embodiments of the disclosure.

According to one or more embodiments, a thin film transistor includes a buffer layer disposed over a substrate, and a semiconductor layer disposed over the buffer layer, wherein the semiconductor layer includes a first area doped with a first conductivity type and disposed adjacent to an upper surface of the semiconductor layer, a second area spaced apart from the first area, doped with the first conductivity type, and disposed adjacent to the upper surface of the semiconductor layer, a third area doped with a second conductivity type different from the first conductivity type and disposed under the first area, and a fourth area doped with the second conductivity type and disposed under the second area.

The thin film transistor may further include a gate insulating layer disposed over the semiconductor layer, and a gate electrode disposed over the gate insulating layer, wherein the first area is disposed on one side of the gate electrode, and the second area is disposed on the other side of the gate electrode.

The semiconductor layer may further include a channel area disposed between the first area and the second area, doped with the first conductivity type, and disposed adjacent to the upper surface of the semiconductor layer.

A doping concentration of the channel area may be less than a doping concentration of the first area and a doping concentration of the second area.

A depth of the first area from the upper surface of the semiconductor layer and a depth of the second area from the upper surface of the semiconductor layer may be greater than a depth of the channel area from the upper surface of the semiconductor layer.

The semiconductor layer may further include a fifth area doped with the second conductivity type and disposed under the third area and the fourth area, and the fifth area may contact an upper surface of the buffer layer.

The buffer layer may include second conductivity type dopants.

A peak concentration of the second conductivity type dopants in the buffer layer may be greater than a peak concentration of the second conductivity type dopants in the fifth area.

A doping concentration of the second conductivity type dopants in the third area and a doping concentration of the second conductivity type dopants in the fourth area may be greater than a doping concentration of the second conductivity type dopants in the fifth area.

The semiconductor layer may further include a first intermediate area disposed between the first area and the third area and including both first conductivity type dopants and second conductivity type dopants, and a second intermediate area disposed between the second area and the fourth area and including both first conductivity type dopants and second conductivity type dopants.

According to one or more embodiments, a display apparatus includes a buffer layer disposed over a substrate, a semiconductor layer disposed over the buffer layer, and a display device electrically connected to the semiconductor layer, wherein the semiconductor layer includes a first area doped with a first conductivity type and disposed adjacent to an upper surface of the semiconductor layer, a second area spaced apart from the first area, doped with the first conductivity type, and disposed adjacent to the upper surface, a third area doped with a second conductivity type different from the first conductivity type and disposed under the first area, and a fourth area doped with the second conductivity type and disposed under the second area.

The thin film transistor may further include a gate insulating layer disposed over the semiconductor layer, and a gate electrode disposed over the gate insulating layer, wherein the first area is disposed on one side of the gate electrode and the second area is disposed on the other side of the gate electrode.

The semiconductor layer may further include a channel area disposed between the first area and the second area, doped with the first conductivity type, and disposed adjacent to the upper surface of the semiconductor layer.

A doping concentration of the channel area may be less than a doping concentration of the first area and a doping concentration of the second area.

A depth of the first area from the upper surface of the semiconductor layer and a depth of the second area from the upper surface of the semiconductor layer may be greater than a depth of the channel area from the upper surface of the semiconductor layer.

The semiconductor layer may further include a fifth area doped with the second conductivity type and disposed under the third area and the fourth area, and the fifth area may contact an upper surface of the buffer layer.

The buffer layer may include second conductivity type dopants.

A peak concentration of the second conductivity type dopants in the buffer layer may be greater than a peak concentration of the second conductivity type dopants in the fifth area.

A doping concentration of second conductivity type dopants in the third area and a doping concentration of the second conductivity type dopants in the fourth area may be greater than a doping concentration of the second conductivity type dopants in the fifth area.

The semiconductor layer may further include a first intermediate area disposed between the first area and the third area and including both first conductivity type dopants and second conductivity type dopants, and a second intermediate area disposed between the second area and the fourth area and including both first conductivity type dopants and second conductivity type dopants.

Other aspects, features, and advantages other than those described above will become apparent from the following detailed description, the appended claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
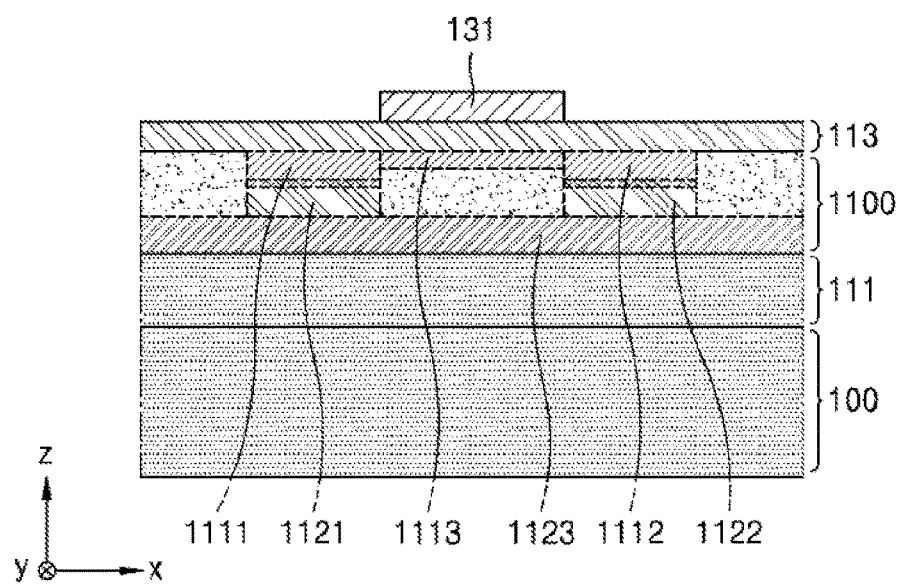
FIG. 1 is a cross-sectional view schematically illustrating a thin film transistor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that when an element such as a layer, a region, or a plate is referred to as being "on" another element, it may be "directly on" the element or may be "indirectly on" the other element with one or more intervening elements therebetween. Also, sizes of elements in the drawings may be exaggerated for convenience of description. In other words, because the sizes and thicknesses of elements in the drawings are arbitrarily illustrated for convenience of description, the disclosure is not limited thereto.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

Figure 2:
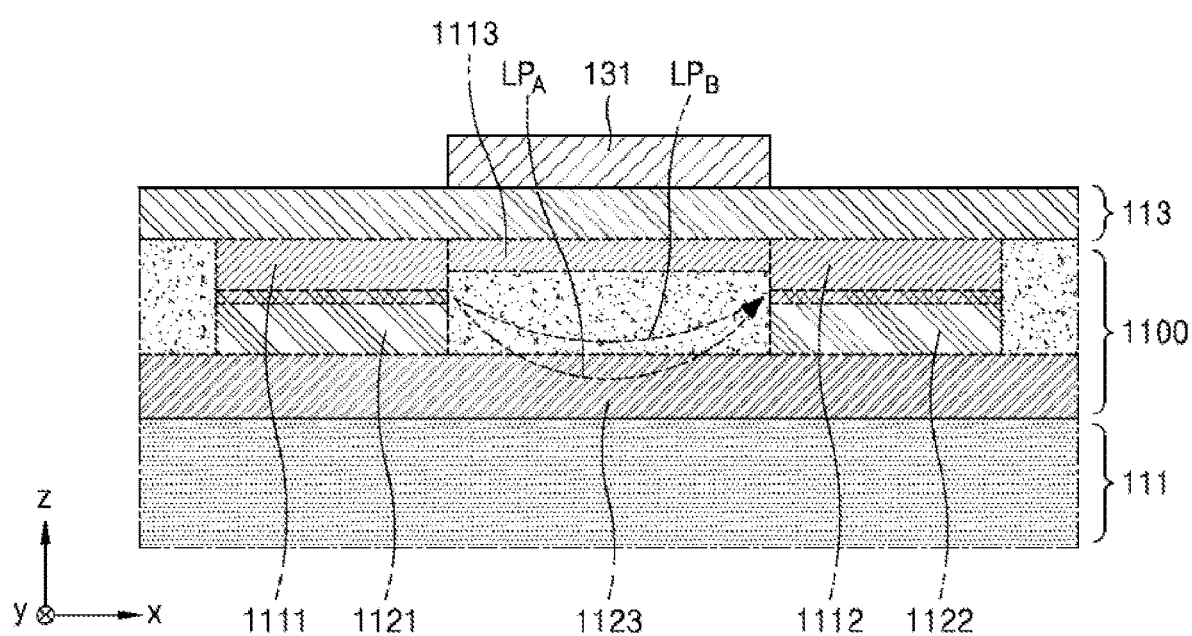
FIG. 2 is an enlarged cross-sectional view schematically illustrating a portion of the thin film transistor of FIG. 1.

FIG. 1 is a cross-sectional view schematically illustrating a thin film transistor according to an embodiment, and FIG. 2 is an enlarged cross-sectional view schematically illustrating a portion of the thin film transistor of FIG. 1. As illustrated in FIG. 1, the thin film transistor according to the present embodiment may include a buffer layer 111 disposed over a substrate 100 and a semiconductor layer 1100 disposed over the buffer layer 111. The semiconductor layer 1100 may include a first area 1111, a second area 1112, a third area 1121, and a fourth area 1122.

The substrate 100 may include glass, metal, or polymer resin. When the substrate 100 is flexible or bendable, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified such as including a multilayer structure including two layers including the polymer resin and a barrier layer located between the two layers and including an inorganic material (e.g., silicon oxide, silicon nitride, or silicon oxynitride).

The buffer layer 111 disposed over the substrate 100 may prevent metal atoms, impurities, or the like from being diffused from the substrate 100 into the semiconductor layer 1100 located thereover. Also, the buffer layer 111 may control a heat supply rate during a crystallization process for forming the semiconductor layer 1100, such that the semiconductor layer 1100 may be uniformly crystallized.

The semiconductor layer 1100 disposed over the buffer layer 111 may include polysilicon. The semiconductor layer 1100 may include polysilicon crystallized at low temperature. The first area 1111 and the second area 1112 may be spaced apart from each other and disposed adjacent to an upper surface of the semiconductor layer 1100. The first area 1111 and the second area 1112 may be doped with a first conductivity type. The first conductivity type may be an n type or a p type. When the first conductivity type is an n type, the first area 1111 and the second area 1112 may include group V elements (e.g., P or As) as dopants. When the first conductivity type is a p type, the first area 1111 and the second area 1112 may include group III elements (e.g., B or In) as dopants. One of the first and second areas 1111 and 1112 may be a source area and the other may be a drain area.

The third area 1121 may be disposed under the first area 1111 and the fourth area 1122 may be disposed under the second area 1112. Like the first area 1111 and the second area 1112, the third area 1121 and the fourth area 1122 may be spaced apart from each other. Also, the third area 1121 and the fourth area 1122 may be doped with a second conductivity type different from the first conductivity type. When the second conductivity type is an n type, the third area 1121 and the fourth area 1122 may include group V elements (e.g., P or As) as dopants. When the second conductivity type is a p type, the third area 1121 and the fourth area 1122 may include group III elements (e.g., B or In) as dopants.

In the semiconductor layer 1100, because the third area 1121 doped with the second conductivity type is located under the first area 1111 doped with the first conductivity type and the fourth area 1122 doped with the second conductivity type is located under the second area 1112 doped with the first conductivity type, a first intermediate area may be formed between the first area 1111 and the third area 1121 and a second intermediate area may be formed between the second area 1112 and the fourth area 1122 as illustrated in FIGS. 1 and 2. Each of the first intermediate area and the second intermediate area may include both first conductivity type dopants and second conductivity type dopants.

A gate insulating layer 113 may be disposed over the semiconductor layer 1100, and the gate insulating layer 113 may include silicon oxide, silicon nitride, silicon oxynitride, or aluminum oxide.

A gate electrode 131 may be disposed over the gate insulating layer 113. The gate electrode 131 may include a metal, an alloy, a conductive metal oxide, or a transparent conductive material. For example, the gate electrode 131 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The gate electrode 131 may have a multilayer structure; for example, the gate electrode 131 may have a two-layer structure of Mo/Al or a three-layer structure of Mo/Al/Mo.

In a view in a direction (z-axis direction) perpendicular to the substrate 100, the first area 1111 may be disposed on one side (−x direction) of the gate electrode 131, and the second area 1112 may be disposed on the other side (+x direction) of the gate electrode 131. Also, when a preset voltage is applied to the gate electrode 131, the thin film transistor may be turned on such that electrical communication may occur between the source area and the drain area, that is, between the first area 1111 and the second area 1112. For example, when the first area 1111 and the second area 1112 are doped with the first conductivity type that is a p type, the thin film transistor may be turned on when a low voltage is applied to the gate electrode 131 and the thin film transistor may be turned off when a high voltage is applied to the gate electrode 131. When the first area 1111 and the second area 1112 are doped with the first conductivity type that is an n type, the thin film transistor may be turned on when a high voltage is applied to the gate electrode 131 and the thin film transistor may be turned off when a low voltage is applied to the gate electrode 131.

Figure 3:
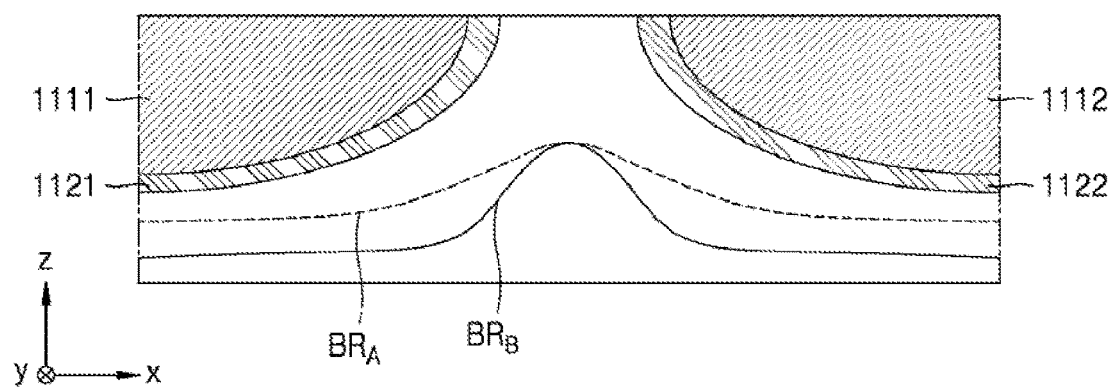
FIG. 3 is a conceptual diagram for describing the operation principle of the thin film transistor of FIG. 1.

FIG. 3 is a conceptual diagram for describing the operation principle of the thin film transistor of FIG. 1. Particularly, FIG. 3 illustrates a barrier depending on energy level in the thin film transistor when the thin film transistor is turned-off. In FIG. 3, a line denoted by a reference symbol BRA may represent a barrier depending on energy level when only the first area 1111 and the second area 1112 exist and the third area 1121 and the fourth area 1122 do not exist, and a line denoted by a reference symbol BRB may represent a barrier depending on energy level when the third area 1121 and the fourth area 1122 described above exist in addition to the first area 1111 and the second area 1112.

In the case of a thin film transistor of the related art, because the length between the first area 1111 and the second area 1112 as the source area and the drain area is sufficiently long, when the thin film transistor is turned-off, no leakage current or a very small amount of leakage current may occur between the first area 1111 and the second area 1112. However, in order to implement a high-resolution display apparatus, the size of the thin film transistor of the display apparatus may be inevitably reduced and accordingly the length between the first area 1111 and the second area 1112 as the source area and the drain area may be reduced, and thus there may be a problem in that the level of a leakage current occurring between the first area 1111 and the second area 1112 when the thin film transistor is turned-off may be high.

However, the thin film transistor according to the present embodiment may include the third area 1121 and the fourth area 1122 disposed below the first area 1111 and the second area 1112, respectively. Accordingly, a barrier having a gentle slope like the line denoted by the reference symbol BRA which represents the barrier depending on energy level when the third area 1121 and the fourth area 1122 do not exist may become a barrier having a steep slope like the line denoted by the reference symbol BRB which represents the barrier depending on energy level when the third area 1121 and the fourth area 1122 described above exist below the first area 1111 and the second area 1112, respectively. Accordingly, the movement of carriers from the first area 1111 to the second area 1112 in the semiconductor layer 1100 when the thin film transistor is turned-off may be further suppressed, and as a result, the level of a leakage current when the thin film transistor is turned-off may be remarkably reduced.

Moreover, the semiconductor layer 1100 included in the thin film transistor may include a doped channel area 1113. That is, a channel area 1113 located between the first area 1111 and the second area 1112 may be doped with the first conductivity type like the first area 1111 and the second area 1112. The channel area 1113 may be disposed adjacent to the upper surface (+z direction) of the semiconductor layer 1100 in the semiconductor layer 1100. As such, because the channel area 1113 is doped with the first conductivity type like the first area 1111 and the second area 1112, the electrical communication between the first area 1111 and the second area 1112 when the thin film transistor is turned-on may be more smoothly performed.

A doping concentration, a number of dopants in an unit area ($cm^3$), in the channel area 1113 may be less than a doping concentration in the first area 1111 and a doping concentration in the second area 1112. For example, the number per unit volume (1 $cm^3$) of dopants in the first area 1111 and the second area 1112 may be about $1 \times 10^{15}$, and the number per unit volume (1 cm$^3$) of dopants in the channel area 1113 may be about 1.6×10$^{12}$. Also, the depth of the first area 1111 from the upper surface of the semiconductor layer 1100 and the depth of the second area 1112 from the upper surface of the semiconductor layer 1100 may be greater than the depth of the channel area 1113 from the upper surface of the semiconductor layer 1100.

Moreover, as illustrated in FIGS. 1 and 2, the semiconductor layer 1100 included in the thin film transistor according to the present embodiment may further include a fifth area 1123. The fifth area 1123 may be doped with the second conductivity type like the third area 1121 and the fourth area 1122. Also, the fifth area 1123 may be located under the third area 1121 and the fourth area 1122. In a view in the direction perpendicular to the substrate 100, the fifth area 1123 may also overlap the channel area 1113 between the first area 1111 and the second area 1112, but the fifth area 1123 may be disposed spaced apart from the channel area 1113 (in the z-axis direction) as illustrated in FIGS. 1 and 2. In order to ensure that the fifth area 1123 is disposed spaced apart from the channel area 1113, the fifth area 1123 may contact the upper surface of the buffer layer 111 disposed under the semiconductor layer 1100.

When the fifth area 1123 does not exist, as indicated by a reference symbol LP$_A$ in FIG. 2, a leakage current may occur between the first area 1111 and the second area 1112 due to the carriers moving under the semiconductor layer 1100 when the thin film transistor is turned-off. However, in the case of the thin film transistor according to the present embodiment, because the semiconductor layer 1100 includes the fifth area 1123 described above, although a leakage current occurs between the first area 1111 and the second area 1112 when the thin film transistor is turned-off, the path of the leakage current may be formed in the semiconductor layer 1100 disposed over the fifth area 1123 as indicated by a reference symbol LP$_B$ in FIG. 2.

Moreover, as described above with reference to FIG. 3, a barrier having a steep slope may be formed by the third area 1121 and the fourth area 1122 like the line denoted by the reference symbol BRB representing the barrier depending on energy level. Thus, the level of the leakage current between the first area 1111 and the second area 1112 when the thin film transistor is turned-off may be remarkably reduced by forming a barrier having a steep slope by the third area 1121 and the fourth area 1122 and by restricting the path of the leakage current to an area disposed over the fifth area 1123 by the fifth area 1123 as indicated by the reference symbol LP$_B$ in FIG. 2.

Because the fifth area 1123 functions to restrict the path of the leakage current and the third area 1121 and the fourth area 1122 function to reduce the level of the leakage current, a doping concentration in the third area 1121 and the fourth area 1122 may be different from a doping concentration in the fifth area 1123. Accordingly, a doping concentration of second conductivity type dopants in the third area 1121 and a doping concentration of second conductivity type dopants in the fourth area 1122 may be greater than a doping concentration of second conductivity type dopants in the fifth area 1123. That is, the number per unit volume of second conductivity type dopants in the third area 1121 and the number per unit volume of second conductivity type dopants in the fourth area 1122 may be greater than the number per unit volume of second conductivity type dopants in the fifth area 1123. For example, the number per unit volume (1 cm$^3$) of second conductivity type dopants in the third area 1121 and the number per unit volume (1 cm$^3$) of second conductivity type dopants in the fourth area 1122 may be 1×10$^{14}$, and the number per unit volume (1 cm$^3$) of second conductivity type dopants in the fifth area 1123 may be 3×10$^{12}$.

In a view in the direction perpendicular to the substrate 100, the fifth area 1123 may have a shape corresponding to the first area 1111, the second area 1112, and the channel area 1113. However, the disclosure is not limited thereto, and the fifth area 1123 may correspond to the entire surface of the buffer layer 111 as illustrated in FIGS. 1 and 2.

As described above, the fifth area 1123 may be disposed spaced apart from the channel area 1113 (in the z-axis direction). Furthermore, in order to ensure that the fifth area 1123 is disposed spaced apart from the channel area 1113, the fifth area 1123 may contact the upper surface of the buffer layer 111 under the semiconductor layer 1100. In this case, the buffer layer 111 may include second conductivity type dopants like the fifth area 1123. Particularly, the number per unit volume of second conductivity type dopants near the upper surface (+z direction) of the buffer layer 111 may be greater than the number per unit volume of second conductivity type dopants in the fifth area 1123. That is, the maximum value of a doping concentration defined as the number per unit volume of second conductivity type dopants in a portion of the buffer layer 111 in the direction to the semiconductor layer 1100 may be greater than the maximum value of a doping concentration defined as the number per unit volume of second conductivity type dopants in the fifth area 1123. This will be described below.

A method of manufacturing the thin film transistor will be described as follows. First, a buffer layer 111 may be formed over a substrate 100, and an amorphous silicon layer may be formed over the buffer layer 111 and then crystallized through an excimer laser annealing process or the like to form a semiconductor layer 1100 that is a polysilicon layer. Subsequently, second conductivity type dopants may be implanted into the semiconductor layer 1100 to form a fifth area 1123 doped with the second conductivity type. Also, first conductivity type dopants may be implanted into the semiconductor layer 1100 to form a channel area 1113 doped with the first conductivity type. In the process of doping by implanting dopants into the semiconductor layer 1100, the depth of an ion implantation, that is, the depth of the dopants in the semiconductor layer 1100, may be adjusted by controlling the level of an acceleration voltage applied during the doping.

Figure 4:
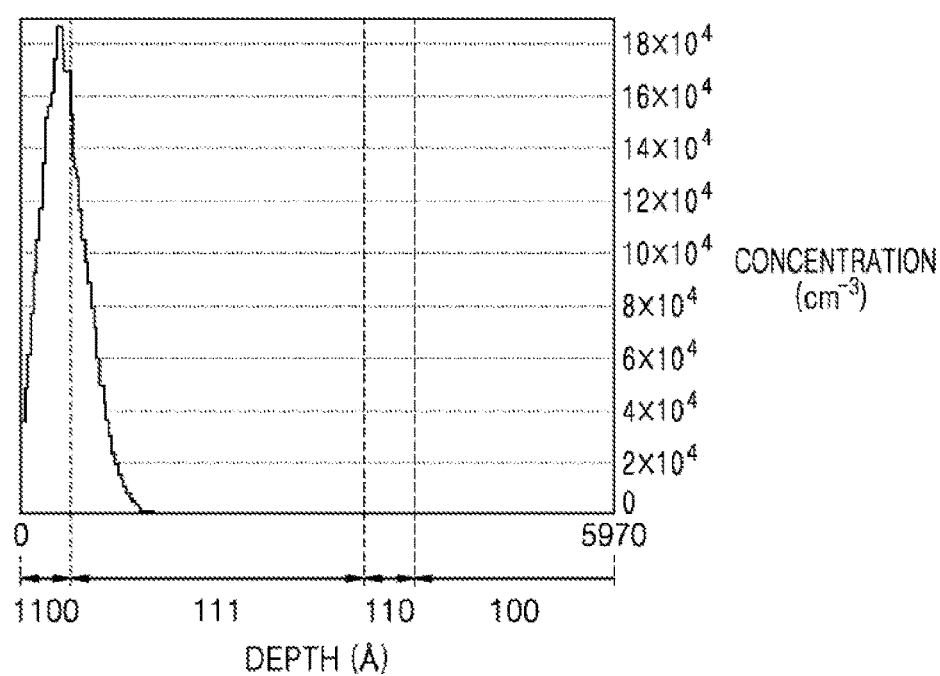
FIGS. 4 and 5 are graphs illustrating a depth profile of dopants.
Figure 5:
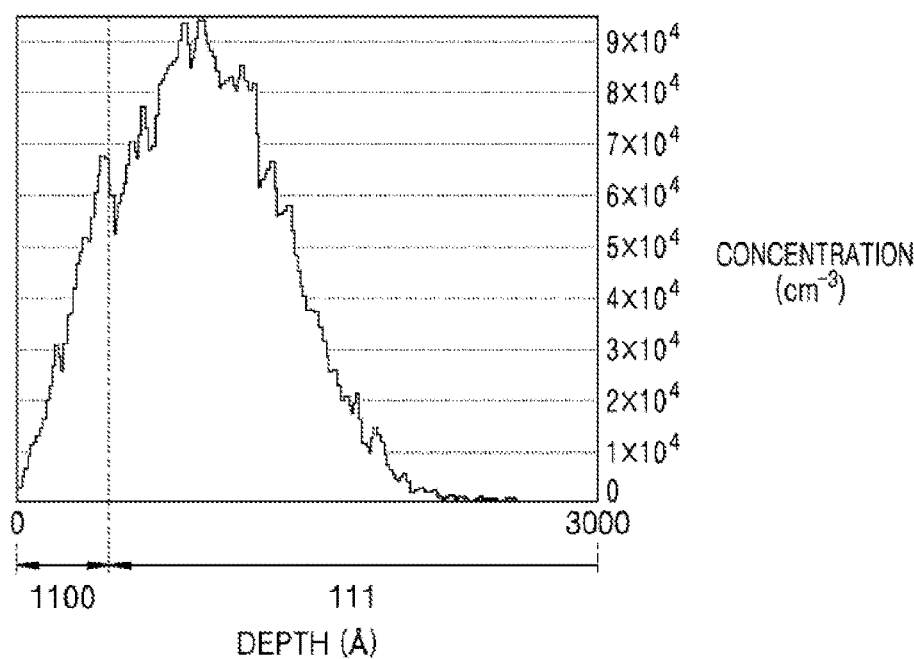

FIGS. 4 and 5 are graphs illustrating a depth profile of dopants.

First, FIG. 4 is a graph illustrating a depth profile of boron when the boron is implanted by using an acceleration voltage of 10 KeV. The horizontal axis of the graph represents depth, the unit of which is Å. The vertical axis thereof represents a concentration of the boron atoms, the number of the boron atoms per unit volume (1 cm$^3$). As may be seen in FIG. 4, when boron (B) as group III elements is implanted by using an acceleration voltage of 10 KeV, a peak concentration of boron may be disposed in the semiconductor layer 1100, and the concentration of boron may decrease rapidly from the peak concentration toward the interface between the semiconductor layer 1100 and the buffer layer 111.

FIG. 5 is a graph illustrating a depth profile of phosphorus (P) as group V elements when the phosphorus (P) is implanted by using an acceleration voltage of 55 KeV. The horizontal axis of the graph represents depth, the unit of which is Å. The vertical axis thereof represents a concentration of the phosphorous atoms, the number of the phosphorous atoms per unit volume (1 cm$^3$) of phosphorus atoms. As may be seen in FIG. 5, when phosphorus (P) as group V elements is implanted by using an acceleration voltage of 55 KeV, a peak concentration of phosphorus may be disposed in the buffer layer 111, not in the semiconductor layer 1100. Accordingly, considering the phosphorus atoms only in the semiconductor layer 1100, the concentration of phosphorus in a portion adjacent to the buffer layer 111 may be highest.

As such, the depth of the peak concentration may be adjusted by controlling the level of the acceleration voltage used in the doping process. Thus, a fifth area 1123 doped with the second conductivity type may be formed in a portion of the semiconductor layer 1100 adjacent to the buffer layer 111 by implanting second conductivity type dopants into the semiconductor layer 1100 by using a relatively high acceleration voltage, and a channel area 1113 doped with the first conductivity type may be formed near the upper surface (z-axis direction) of the semiconductor layer 1100 by implanting first conductivity type dopants into the semiconductor layer 1100 by using a relatively low acceleration voltage. When forming the fifth area 1123 doped with the second conductivity type or the channel area 1113 doped with the first conductivity type, only a preset area may be selectively doped by using a mask, when necessary.

Through this process, the concentration of dopants in the channel area 1113 may be about $1.6 \times 10^{12}$ and the concentration of dopants in the fifth area 1123 may be about $3 \times 10^{12}$.

Moreover, in order to control the peak concentration of the second conductivity type dopants in the semiconductor layer 1100 to be disposed in a region adjacent to the buffer layer 111, a considerable amount of second conductivity type dopants may also be in the buffer layer 111 as illustrated in FIG. 5. Particularly, as illustrated in FIG. 5, the concentration of second conductivity type dopants near the upper surface (+z direction) of the buffer layer 111 may be greater than the concentration of second conductivity type dopants in the fifth area 1123 of the semiconductor layer 1100. That is, as illustrated in FIG. 5, the peak concentration of the second conductivity type dopants may not be located in the semiconductor layer 1100 but may be located in the buffer layer 111. In the semiconductor layer 1100 and the buffer layer 111, the concentration of the second conductivity type dopants may exhibit an approximate Gaussian distribution as illustrated in FIG. 5 and the peak thereof may be located in the buffer layer 111. That is, the maximum concentration of second conductivity type dopants in the buffer layer 111 may be greater than the maximum concentration of second conductivity type dopants in the fifth area 1123 of the semiconductor layer 1100.

Subsequently, a gate insulating layer 113 may be formed over the semiconductor layer 1100, and a gate electrode 131 may be formed over the gate insulating layer 113. Then, a first area 1111, a second area 1112, a third area 1121, and a fourth area 1122 may be formed by doping the semiconductor layer 1100 by using the gate electrode 131 as a self-aligned mask. An acceleration voltage for forming the first area 1111 and the second area 1112 doped with the first conductivity type by using the first conductivity type dopants may be lower than an acceleration voltage for forming the third area 1121 and the fourth area 1122 doped with the second conductivity type by using the second conductivity type dopants. This may be because the depth at which the first conductivity type dopants are located may be different from the depth at which the second conductivity type dopants are located. Particularly, an acceleration voltage for forming the first area 1111 and the second area 1112 doped with the first conductivity type by using the first conductivity type dopants may be 33 KeV, and an acceleration voltage for forming the third area 1121 and the fourth area 1122 doped with the second conductivity type by using the second conductivity type dopants may be 80 KeV. An acceleration voltage for doping the first area 1111, the second area 1112, the third area 1121, and the fourth area 1122 may be higher than an accelerating voltage for doping the channel area 1113 and the fifth area 1123, because the first area 1111, the second area 1112, the third area 1121, and the fourth area 1122 are doped after the gate insulating layer 113 is formed.

Through this process, the number per unit volume (1 cm³) of dopants in the first area 1111 and the second area 1112 may be about $1 \times 10^{15}$, and the number per unit volume (1 cm 3) of dopants in the third area 1121 and the fourth area 1122 may be about $1 \times 10^{14}$.

Figure 6:
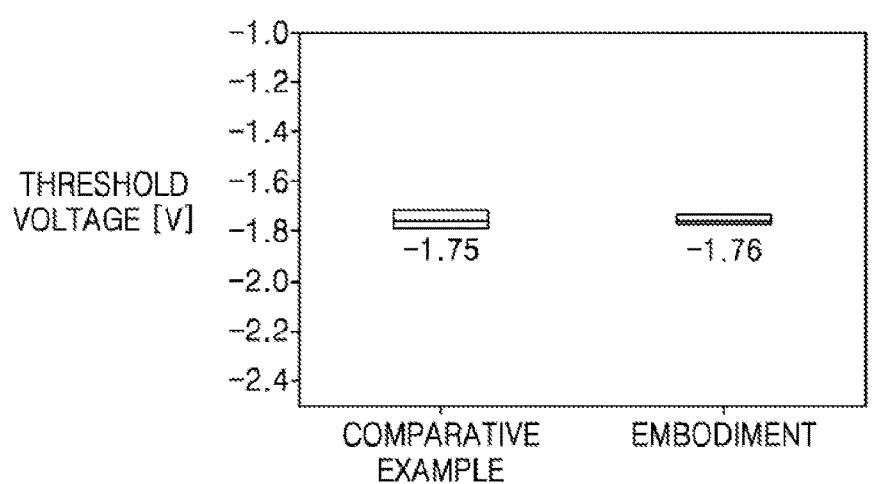
FIG. 6 is a graph for comparing threshold voltages in a thin film transistor according to a comparative example and a thin film transistor according to an embodiment.

FIG. 6 is a graph for comparing threshold voltages in a thin film transistor according to a comparative example and a thin film transistor according to the present embodiment. The thin film transistor according to the comparative example may be a thin film transistor that does not include the third area 1121, the fourth area 1122, and the fifth area 1123. As may be seen in FIG. 6, the dispersion of a threshold voltage in the thin film transistors according to the present embodiment may be less than the dispersion of a threshold voltage in the thin film transistors according to the comparative example. Thus, in the case of the display apparatus including the thin film transistors according to the present embodiment, the image quality degradation due to the threshold voltage deviation of the thin film transistors may be reduced.

Figure 7:
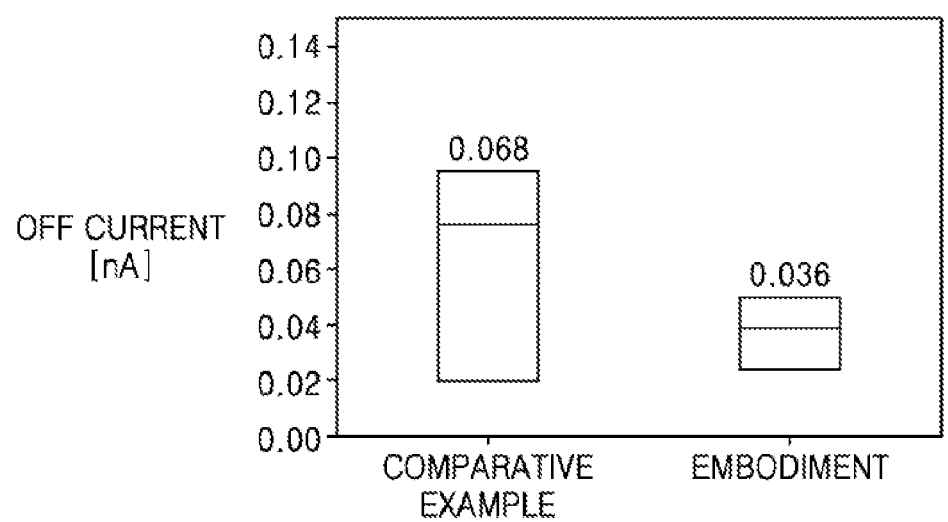
FIG. 7 is a graph for comparing off currents in a thin film transistor according to a comparative example and a thin film transistor according to an embodiment.

FIG. 7 is a graph for comparing off currents in a thin film transistor according to a comparative example and a thin film transistor according to the present embodiment. As may be seen in FIG. 7, the dispersion of an off current in the thin film transistors according to the present embodiment may be less than the dispersion of an off current in the thin film transistors according to the comparative example. Furthermore, the average off current in the thin film transistors according to the comparative example may be 0.068 nA, whereas the average off current in the thin film transistors according to the present embodiment may be only 0.036 nA that is equal to about the half thereof.

Figure 8:
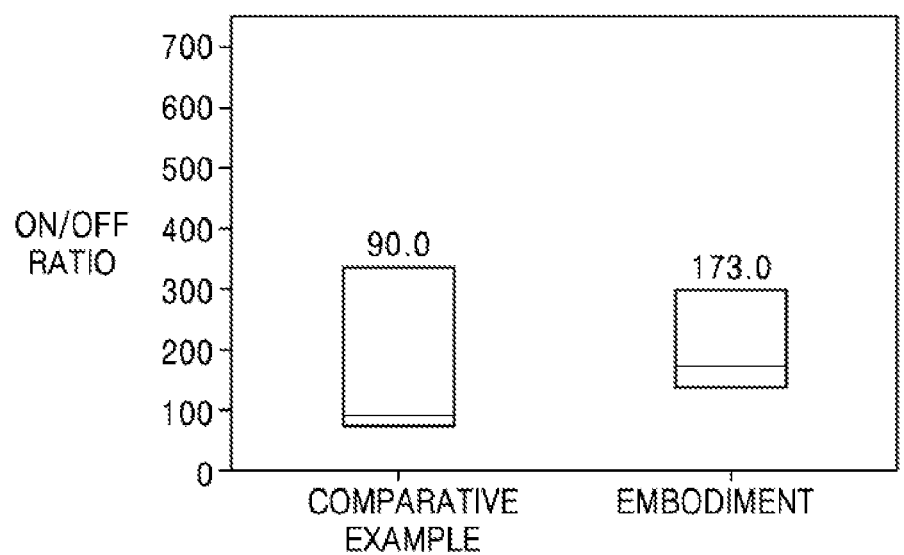
FIG. 8 is a graph for comparing on/off ratios in a thin film transistor according to a comparative example and a thin film transistor according to an embodiment.

FIG. 8 is a graph for comparing on/off ratios in a thin film transistor according to a comparative example and a thin film transistor according to the present embodiment. The on/off ratio may be the ratio of the level of a current in the turn-on state of the thin film transistor to the level of a leakage current in the turn-off state of the thin film transistor, and the on-off characteristics of the thin film transistor may be excellent as the value of the on/off ratio increases. As may be seen in FIG. 8, the dispersion of an on/off ratio in the thin film transistors according to the present embodiment may be less than the dispersion of an on/off ratio in the thin film transistors according to the comparative example. Furthermore, the on/off ratio in the thin film transistors according to the comparative example may be 90, whereas the on/off ratio in the thin film transistors according to the present embodiment may be up to 173 that is equal to about two times thereof.

Figure 9:
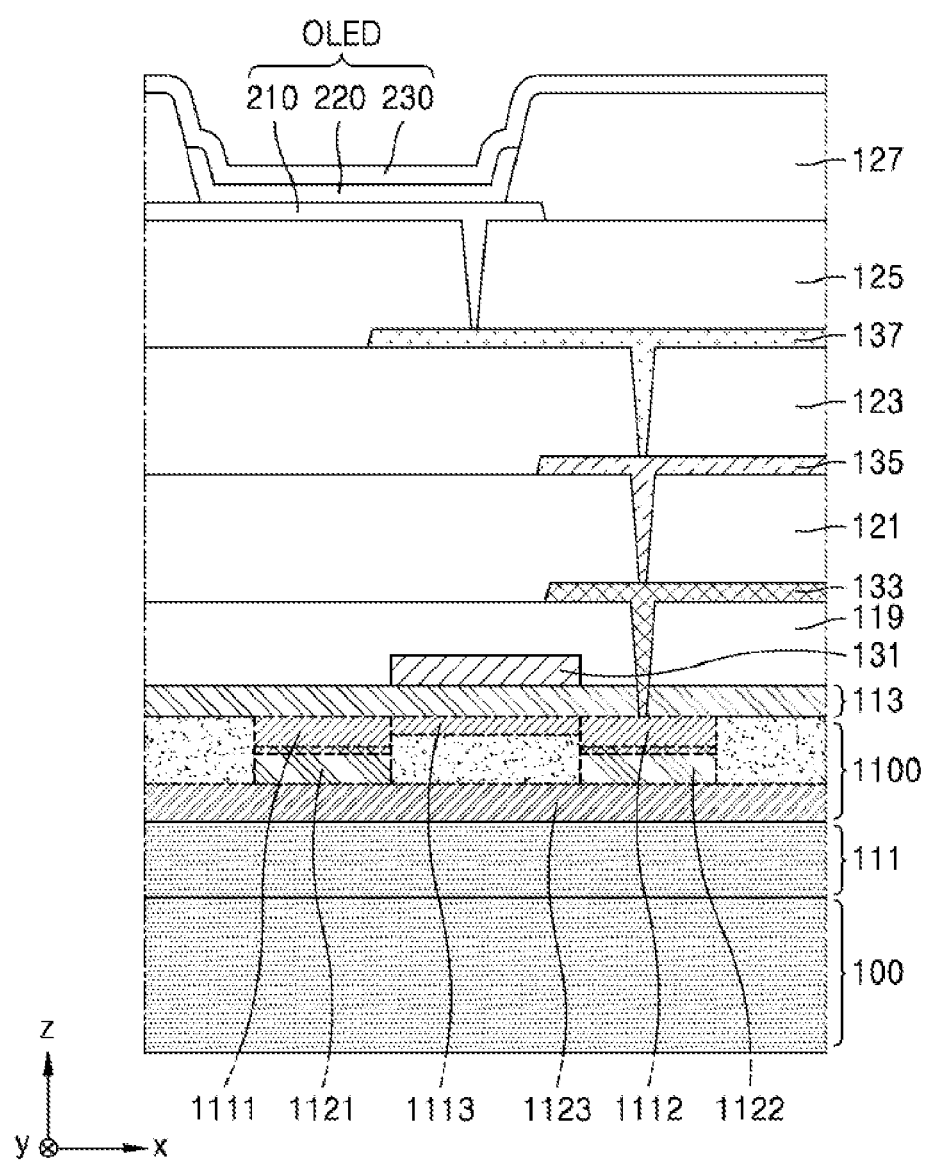
FIG. 9 is a cross-sectional view schematically illustrating a display apparatus according to an embodiment.

Such a thin film transistor may be used in a display apparatus. That is, not only a thin film transistor described above but also a display apparatus including the thin film transistor and a display device electrically connected thereto may be within the scope of the disclosure. FIG. 9 is a cross-sectional view schematically illustrating a display apparatus according to an embodiment.

The display apparatus according to the present embodiment may include a substrate 100, a buffer layer 111 disposed over the substrate 100, a semiconductor layer 1100 disposed over the buffer layer 111, a gate insulating layer 113 disposed over the semiconductor layer 1100, and a gate electrode 131 disposed over the gate insulating layer 113, as described above. Descriptions thereof may be the same as those described above.

A first interlayer insulating layer 119 may be disposed over the gate insulating layer 113. The first interlayer insulating layer 119 may include silicon oxide, silicon nitride, silicon oxynitride, or aluminum oxide. A second interlayer insulating layer 121 may be disposed over the first interlayer insulating layer 119. The second interlayer insulating layer 121 may include silicon oxide, silicon nitride, silicon oxynitride, or aluminum oxide. A first planarization layer 123 may be disposed over the second interlayer insulating layer 121, and a second planarization layer 125 may be disposed over the first planarization layer 123. Each of the first planarization layer 123 and the second planarization layer 125 may include an organic insulating material. For example, each of the first planarization layer 123 and the second planarization layer 125 may include a photoresist, benzocyclobutene (BCB), polyimide, hexamethyldisiloxane (HMDSO), polymethylmethacrylate (PMMA), polystyrene, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any mixture thereof.

A first connection electrode 133 may be located between the first interlayer insulating layer 119 and the second interlayer insulating layer 121. The first connection electrode 133 may contact any one of the first area 1111 and the second area 1112 of the thin film transistor through a contact hole formed in the gate insulating layer 113 and the first interlayer insulating layer 119. The first connection electrode 133 may include a metal, an alloy, a conductive metal oxide, or a transparent conductive material. For example, the first connection electrode 133 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). The first connection layer 133 may have a multilayer structure; for example, the first connection layer 133 may have a two-layer structure of Mo/Al or a three-layer structure of Mo/Al/Mo.

A second connection electrode 135 located between the second interlayer insulating layer 121 and the first planarization layer 123 may be electrically connected to the first connection electrode 133 through a contact hole formed in the second interlayer insulating layer 121. A third connection electrode 137 located between the first planarization layer 123 and the second planarization layer 125 may be electrically connected to the second connection electrode 135 through a contact hole formed in the first planarization layer 123. Each of the second connection electrode 135 and the third connection electrode 137 may include a metal, an alloy, a conductive metal oxide, or a transparent conductive material. For example, each of the second connection electrode 135 and the third connection electrode 137 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), or indium zinc oxide (IZO). Each of the second connection electrode 135 and the third connection electrode 137 may have a multilayer structure; for example, each of the second connection electrode 135 and the third connection electrode 137 may have a two-layer structure of Ti/Al or a three-layer structure of Ti/Al/Ti.

An organic light emitting diode OLED may be disposed over the second planarization layer 125. The organic light emitting diode OLED may include a pixel electrode 210, an intermediate layer 220 including an emission layer, and an opposite electrode 230. The pixel electrode 210 may be electrically connected to the third connection electrode 137 through a contact hole formed in the second planarization layer 125 and thus may be electrically connected to the thin film transistor.

The pixel electrode 210 may be a (semi)transparent electrode or a reflective electrode. For example, the pixel electrode 210 may include a reflective layer including Ag, Mg, Al, Pt, Pd, Au, Ni, Nd, Ir, Cr, or any compound thereof and a transparent or semitransparent electrode layer disposed over the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may have a three-layer structure of ITO/Ag/ITO.

A pixel definition layer 127 may be arranged over the second planarization layer 125. The pixel definition layer 127 may increase a distance between edges of the pixel electrode 210 and the opposite electrode 230 disposed over the pixel electrode 210 to prevent an arc or the like from occurring at the edges of the pixel electrode 210.

The pixel definition layer 127 may be formed of one or more organic insulating materials among polyimide, polyamide, acrylic resin, benzocyclobutene, and phenol resin by spin coating or the like.

At least a portion of the intermediate layer 220 of the organic light emitting diode OLED may be located in an opening formed in the pixel definition layer 127. An emission area of the organic light emitting diode OLED may be defined by the opening.

The intermediate layer 220 may include an emission layer. The emission layer may include an organic material including a fluorescent or phosphorescent material emitting red, green, blue, or white light. The emission layer may include a low molecular weight organic material or a high molecular weight organic material, and functional layers such as a hole transport layer (HTL), a hole injection layer (HIL), an electron transport layer (ETL), and an electron injection layer (EIL) may optionally be further arranged under and over the emission layer.

The emission layer may have a patterned shape corresponding to each of the pixel electrodes 210. Layers other than the emission layer included in the intermediate layer 220 may be variously modified. Layers other than the emission layer may be integrally formed as a single body across a plurality of pixel electrodes 210.

The opposite electrode 230 may be a transparent electrode or a reflective electrode. For example, the opposite electrode 230 may be a transparent or semitransparent electrode and may include Li, Ca, Al, Ag, Mg, or any compound thereof (for example, LiF). Also, the opposite electrode 230 may further include a transparent conductive oxide (TCO) layer such as ITO, IZO, ZnO, or $In_2O_3$ disposed over a thin metal layer. The opposite electrode 230 may be integrally formed as a single body over the entire surface of a display area and may be arranged over the intermediate layer 220 and the pixel definition layer 127.

The organic light emitting diode OLED may be covered by a thin film encapsulation layer (not illustrated) or an encapsulation substrate. In an embodiment, the thin film encapsulation layer may include at least one inorganic encapsulation layer and at least one organic encapsulation layer. For example, the thin film encapsulation layer may include a first inorganic encapsulation layer, a second inorganic encapsulation layer, and an organic encapsulation layer disposed therebetween.

The first inorganic encapsulation layer and the second inorganic encapsulation layer may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_x$) and may be formed by chemical vapor deposition (CVD) or the like. Zinc oxide ($ZnO_x$) may be either ZnO or $ZnO_2$. The organic encapsulation layer may include a polymer-based material. The polymer-based material may include silicon-based resin, acryl-based resin (e.g., polymethylmethacrylate or polyacrylic acid), epoxy-based resin, polyimide, or polyethylene.

Each of the first inorganic encapsulation layer, the organic encapsulation layer, and the second inorganic encapsulation layer may be integrally formed as a single body to cover the display area.

As such, in the case of the display apparatus according to the present embodiment, a high-quality image may be displayed by controlling the operation of the display device such as the organic light emitting diode OLED by using the thin film transistor having a small size and a maximally-suppressed leakage current. Also, the display apparatus capable of realizing a true black may be implemented by remarkably reducing the amount of a leakage current when the thin film transistor is turned-off.

As described above, according to an embodiment, a thin film transistor capable of minimizing the level of a leakage current and a display apparatus including the same may be implemented. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin film transistor comprising:
   a buffer layer disposed over a substrate; and
   a semiconductor layer disposed over the buffer layer,
   wherein the semiconductor layer includes:
   a first area doped with a first conductivity type and disposed adjacent to an upper surface of the semiconductor layer,
   a second area spaced apart from the first area, doped with the first conductivity type, and disposed adjacent to the upper surface of the semiconductor layer,
   a third area doped with a second conductivity type different from the first conductivity type and disposed under the first area, and
   a fourth area doped with the second conductivity type and disposed under the second area.

2. The thin film transistor of claim 1, further comprising:
   a gate insulating layer disposed over the semiconductor layer; and
   a gate electrode disposed over the gate insulating layer,
   wherein the first area is disposed on one side of the gate electrode and the second area is disposed on the other side of the gate electrode.

3. The thin film transistor of claim 1, wherein the semiconductor layer further includes a first intermediate area disposed between the first area and the third area, and including both first conductivity type dopants and second conductivity type dopants, and a second intermediate area disposed between the second area and the fourth area and including both first conductivity type dopants and second conductivity type dopants.

4. The thin film transistor of claim 1, wherein the semiconductor layer further includes a channel area disposed between the first area and the second area, doped with the first conductivity type, and disposed adjacent to the upper surface of the semiconductor layer.

5. The thin film transistor of claim 4, wherein a doping concentration of the channel area is less than a doping concentration of the first area and a doping concentration of the second area.

6. The thin film transistor of claim 4, wherein a depth of the first area from the upper surface of the semiconductor layer and a depth of the second area from the upper surface of the semiconductor layer are greater than a depth of the channel area from the upper surface of the semiconductor layer.

7. The thin film transistor of claim 1, wherein the semiconductor layer further includes a fifth area doped with the second conductivity type and disposed under the third area and the fourth area, and
   wherein the fifth area contacts an upper surface of the buffer layer.

8. The thin film transistor of claim 7, wherein a doping concentration of the second conductivity type dopants in the third area and a doping concentration of the second conductivity type dopants in the fourth area are greater than a doping concentration of the second conductivity type dopants in the fifth area.

9. The thin film transistor of claim 7, wherein the buffer layer includes second conductivity type dopants.

10. The thin film transistor of claim 9, wherein a peak concentration of the second conductivity type dopants in the buffer layer is greater than a peak concentration of the second conductivity type dopants in the fifth area.

11. A display apparatus comprising:
    a buffer layer disposed over a substrate;
    a semiconductor layer disposed over the buffer layer; and
    a display device electrically connected to the semiconductor layer,
    wherein the semiconductor layer includes:
    a first area doped with a first conductivity type and disposed adjacent to an upper surface of the semiconductor layer,
    a second area spaced apart from the first area, doped with the first conductivity type, and disposed adjacent to the upper surface of the semiconductor layer, a third area doped with a second conductivity type different from the first conductivity type and disposed under the first area, and a fourth area doped with the second conductivity type and disposed under the second area.

12. The display apparatus of claim 11, further comprising:
a gate insulating layer disposed over the semiconductor layer; and
a gate electrode disposed over the gate insulating layer,
wherein the first area is disposed on one side of the gate electrode and the second area is disposed on the other side of the gate electrode.

13. The display apparatus of claim 11, wherein the semiconductor layer further includes a first intermediate area disposed between the first area and the third area, and including both first conductivity type dopants and second conductivity type dopants, and a second intermediate area disposed between the second area and the fourth area and including both first conductivity type dopants and second conductivity type dopants.

14. The display apparatus of claim 11, wherein the semiconductor layer further includes a channel area disposed between the first area and the second area, doped with the first conductivity type, and disposed adjacent to the upper surface of the semiconductor layer.

15. The display apparatus of claim 14, wherein a doping concentration of the channel area is less than a doping concentration of the first area and a doping concentration of the second area.

16. The display apparatus of claim 14, wherein a depth of the first area from the upper surface of the semiconductor layer and a depth of the second area from the upper surface of the semiconductor layer are greater than a depth of the channel area from the upper surface of the semiconductor layer.

17. The display apparatus of claim 11, wherein the semiconductor layer further includes a fifth area doped with the second conductivity type and disposed under the third area and the fourth area, and wherein the fifth area contacts an upper surface of the buffer layer.

18. The display apparatus of claim 17, wherein a doping concentration of second conductivity type dopants in the third area and a doping concentration of the second conductivity type dopants in the fourth area are greater than a doping concentration of the second conductivity type dopants in the fifth area.

19. The display apparatus of claim 17, wherein the buffer layer includes second conductivity type dopants.

20. The display apparatus of claim 19, wherein a peak concentration of the second conductivity type dopants in the buffer layer is greater than a peak concentration of the second conductivity type dopants in the fifth area.

* * * * *